US011765864B2

(12) United States Patent
Chehade et al.

(10) Patent No.: US 11,765,864 B2
(45) Date of Patent: Sep. 19, 2023

(54) COOLING ARRANGEMENT FOR A RACK HOSTING ELECTRONIC EQUIPMENT AND AT LEAST ONE FAN

(71) Applicant: OVH, Roubaix (FR)

(72) Inventors: Ali Chehade, Templeuve (FR); Hadrien Bauduin, Villeneuve d'Ascq (FR); Henryk Klaba, Roubaix (FR)

(73) Assignee: OVH, Roubaix (FR)

(*) Notice: Subject to any disclaimer, the term of this patent is extended or adjusted under 35 U.S.C. 154(b) by 171 days.

(21) Appl. No.: 16/995,487

(22) Filed: Aug. 17, 2020

(65) Prior Publication Data
US 2021/0068305 A1 Mar. 4, 2021

(30) Foreign Application Priority Data

Aug. 26, 2019 (EP) .................................... 19315103
Nov. 29, 2019 (EP) .................................... 19315150

(51) Int. Cl.
*F28F 7/00* (2006.01)
*H05K 7/20* (2006.01)

(52) U.S. Cl.
CPC ....... *H05K 7/20627* (2013.01); *H05K 7/2079* (2013.01); *H05K 7/20263* (2013.01);
(Continued)

(58) Field of Classification Search
CPC .......... H05K 7/20645; H05K 7/20736; H05K 7/20781
(Continued)

(56) References Cited

U.S. PATENT DOCUMENTS 4,138,857 A * 2/1979 Dankowski ........... F28D 1/0435
62/239
6,182,742 B1 2/2001 Takahashi et al.
(Continued)

FOREIGN PATENT DOCUMENTS

CN 101132688 A 2/2008
CN 107112859 A 8/2017
(Continued)

OTHER PUBLICATIONS

Notice of Allowance with regard to the counterpart U.S. Appl. No. 17/002,201 dated Sep. 1, 2021.
(Continued)

*Primary Examiner* — Davis D Hwu
(74) *Attorney, Agent, or Firm* — BCF LLP

(57) ABSTRACT

A cooling arrangement for a rack hosting electronic equipment and at least one fan comprises first and second air-liquid heat exchangers. A first one is mounted to the rack so that heated air expelled from the rack by the fan flows therethrough. The second one is mounted to the first one so that air having flowed through the first heat exchanger flows through the second heat exchanger. Each heat exchanger comprises a frame, an inlet receiving liquid from a cold supply line, an outlet returning liquid to a hot return line, and a continuous internal conduit forming a plurality of interconnected parallel sections. The cooling arrangement is mounted to the rack so that the first and second frames are parallel and adjacent. One interconnected parallel section of the first heat exchanger nearest to its inlet is proximate one interconnected parallel section of the second heat exchanger nearest to its outlet.

14 Claims, 11 Drawing Sheets

(52) U.S. Cl.
CPC ..... *H05K 7/20554* (2013.01); *H05K 7/20736* (2013.01); *H05K 7/20781* (2013.01)

(58) Field of Classification Search
USPC ........................................................ 165/80.4
See application file for complete search history.

(56) References Cited

U.S. PATENT DOCUMENTS

| | | | |
|---|---|---|---|
| 6,729,387 | B2 | 5/2004 | Duong et al. |
| 7,149,084 | B2 | 12/2006 | Matsushima et al. |
| 7,436,666 | B1 | 10/2008 | Konshak |
| 7,599,184 | B2 | 10/2009 | Upadhya et al. |
| 7,715,194 | B2 | 5/2010 | Brewer et al. |
| 7,757,506 | B2 | 7/2010 | Ellsworth et al. |
| 7,963,119 | B2 | 6/2011 | Campbell et al. |
| 8,051,897 | B2 | 11/2011 | Campbell et al. |
| 8,250,879 | B2 | 8/2012 | Macbain et al. |
| 8,274,790 | B2 | 9/2012 | Campbell et al. |
| 8,351,200 | B2 | 1/2013 | Arimilli et al. |
| 8,395,896 | B2 | 3/2013 | Belady |
| 8,514,575 | B2 | 8/2013 | Goth et al. |
| 8,622,116 | B2 * | 1/2014 | Yang ................ F28D 1/0477 165/170 |
| 8,687,364 | B2 | 4/2014 | Chainer et al. |
| 8,789,384 | B2 | 7/2014 | Eckberg et al. |
| 8,925,333 | B2 | 1/2015 | Campbell et al. |
| 9,173,324 | B2 | 10/2015 | Campbell et al. |
| 9,291,408 | B2 | 3/2016 | Iyengar et al. |
| 9,295,182 | B2 | 3/2016 | Iyengar et al. |
| 9,313,930 | B2 | 4/2016 | Goth et al. |
| 9,494,371 | B2 | 11/2016 | Werner et al. |
| 9,592,717 | B2 | 3/2017 | Katoh |
| 9,686,891 | B2 | 6/2017 | Campbell et al. |
| 9,769,954 | B2 | 9/2017 | Bonnin et al. |
| 9,943,014 | B2 | 4/2018 | Lyon et al. |
| 10,202,857 | B2 | 2/2019 | Simonds et al. |
| 10,225,958 | B1 | 3/2019 | Gao |
| 10,244,655 | B2 | 3/2019 | Chainer et al. |
| 2006/0144070 | A1 | 7/2006 | Perthold et al. |
| 2007/0153474 | A1 | 7/2007 | Andersen et al. |
| 2008/0266726 | A1 | 10/2008 | Murakami et al. |
| 2009/0000771 | A1 | 1/2009 | Horn et al. |
| 2009/0262501 | A1 | 10/2009 | Claassen et al. |
| 2011/0265983 | A1 | 11/2011 | Pedersen |
| 2012/0279684 | A1 | 11/2012 | Keisling et al. |
| 2013/0118712 | A1 | 5/2013 | Iyengar et al. |
| 2013/0138252 | A1 | 5/2013 | Chainer et al. |
| 2013/0174421 | A1 | 7/2013 | Chainer et al. |
| 2013/0205822 | A1 | 8/2013 | Heiland et al. |
| 2013/0206364 | A1 | 8/2013 | Fehrenbach et al. |
| 2014/0374072 | A1 | 12/2014 | Seewald et al. |
| 2016/0088768 | A1 | 3/2016 | Wang et al. |
| 2017/0074591 | A1 | 3/2017 | Kim et al. |
| 2017/0181328 | A1 | 6/2017 | Shelnutt et al. |
| 2017/0241714 | A1 | 8/2017 | Stark |
| 2018/0192552 | A1 | 7/2018 | Tan et al. |
| 2019/0124798 | A1 | 4/2019 | Luo et al. |
| 2019/0150326 | A1 | 5/2019 | Gao et al. |

FOREIGN PATENT DOCUMENTS

| | | | | |
|---|---|---|---|---|
| CN | 206459329 | U | | 9/2017 |
| CN | 108323124 | A | | 7/2018 |
| CN | 106385784 | B | | 9/2018 |
| CN | 109210839 | A | | 1/2019 |
| EP | 3654743 | A1 | * | 5/2020 ........... H05K 7/1488 |
| ES | 2613068 | T3 | * | 5/2017 |
| WO | WO2007076985 | A2 | * | 7/2007 |
| WO | 2018/069633 | A1 | | 4/2018 |

OTHER PUBLICATIONS

European Search Report with regard to the counterpart European Patent Application No. 19315103.2 completed Feb. 4, 2020.
English Translation of CN108323124 retrieved on Espacenet on Feb. 3, 2020.
English Translation of CN106385784 retrieved on Espacenet on Jan. 31, 2020.
European Search Report with regard to the counterpart European Patent Application No. 19315150.3 completed Apr. 30, 2020.
Office Action with regard to the counterpart CN Patent Application No. 2020108629708 dated Sep. 13, 2022.
English Abstract for CN206459329 retrieved on Espacenet on Sep. 19, 2022.
English Abstract for CN101132688 retrieved on Espacenet on Sep. 19, 2022.
English Abstract for CN109210839 retrieved on Espacenet on Sep. 19, 2022.
English Abstract for CN107112859 retrieved on Espacenet on Sep. 19, 2022.

* cited by examiner

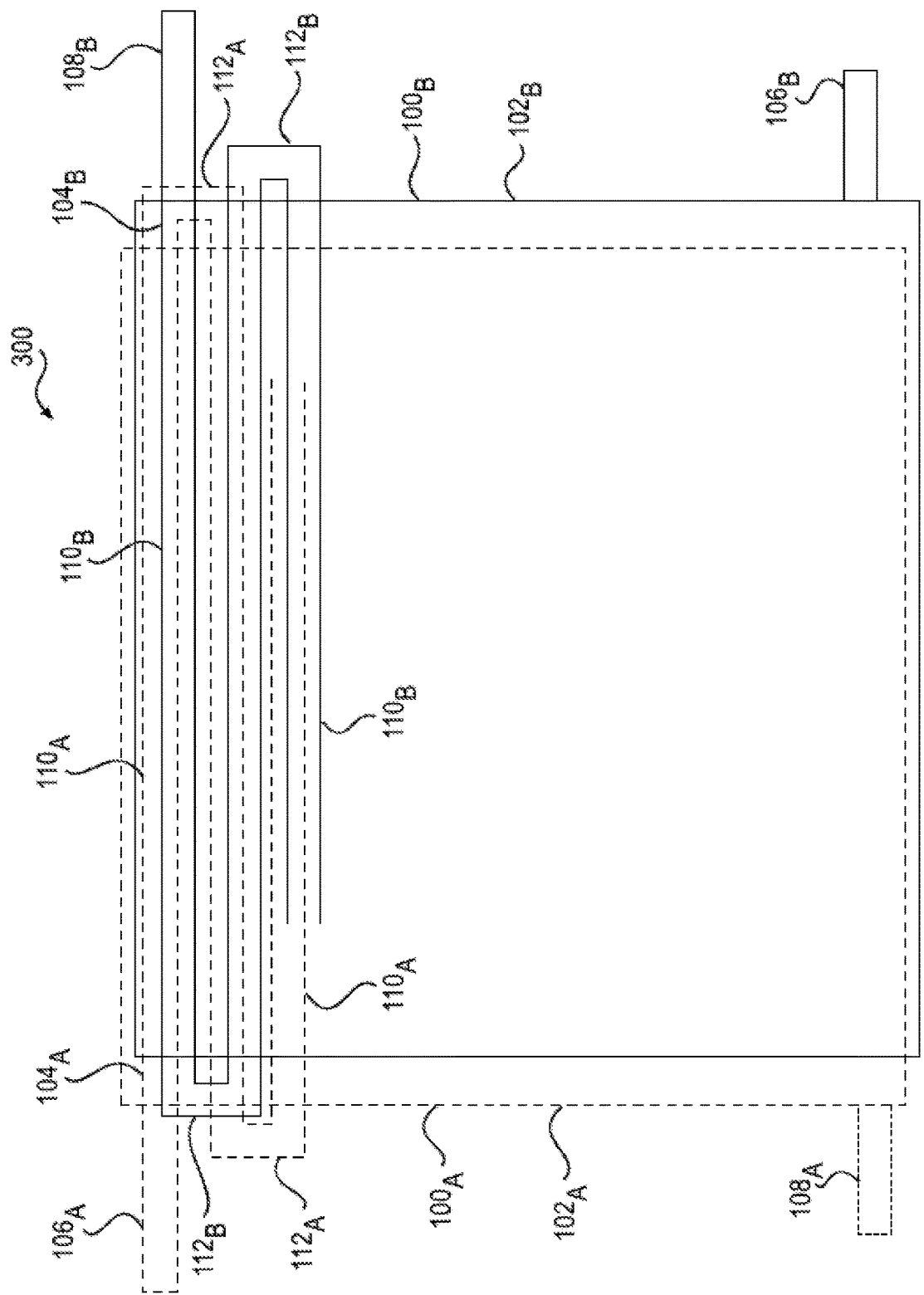

COOLING ARRANGEMENT FOR A RACK HOSTING ELECTRONIC EQUIPMENT AND AT LEAST ONE FAN

CROSS REFERENCE

The present application claims priority from European Patent Application No. 19315103.2 filed on Aug. 26, 2019, and on European Patent Application No. 19315150.3, filed on Nov. 29, 2019, the entirety of both of which is incorporated by reference herein.

FIELD

The present technology relates to cooling techniques for electronic equipment. In particular, a cooling arrangement for a rack hosting electronic equipment and at least one fan is disclosed.

BACKGROUND

Electronic equipment, for example servers, memory banks, computer discs, and the like, is conventionally grouped in equipment racks. Large data centers that may contain thousands of racks supporting thousands or even tens of thousands of servers.

The racks, including equipment mounted in their backplanes, consume large amounts of electric power and generate significant amounts of heat. Cooling needs are important in such racks. Some electronic devices, such as processors, generate so much heat that they could fail within seconds in case of a lack of cooling.

Fans are commonly mounted within equipment racks to provide forced ventilation cooling to rack-mounted equipment. This solution merely displaces some of the heat generated within the racks to the general environment of the data center. Air-liquid heat exchangers, finned tubes heat exchangers similar to radiators, may be mounted to the racks to absorb and transport some of this displaced heat to further cooling equipment, for example cooling towers, located outside of the data center. For example, FIG. 1 is a highly schematic perspective view of a server rack on which three (3) air-liquid heat exchangers are mounted. A server rack 10 hosts a number of servers (not shown) that generate a significant amount of heat. A number of fans 12 (six fans are shown without limiting the present disclosure) expel heated air from the server rack 10 in a direction of three (3) air-liquid heat exchangers 14 mounted behind a backplane 20 of the server rack 10. On FIG. 1, the air-liquid heat exchangers 14 are shown in transparent form in order to render the fans 12 visible. The air-liquid heat exchangers 14 receive cold liquid, for example water, from a cold liquid line 16 and return heated liquid to a hot liquid line 18. The airflow having passed through the air-liquid heat exchangers 14 is somewhat cooled down to allow maintaining an ambient temperature of the data center to a reasonable level.

FIG. 2 is a schematic diagram of a single-flow air-liquid heat exchanger. A single-flow heat exchanger 100 comprises a frame 102 and a continuous internal conduit 104. The continuous internal conduit 104 is connected at one end to liquid inlet 106 and at an opposite end to a liquid outlet 108. The liquid inlet 106 is connectable to a supply line such as the cold liquid line 16 for receiving a cold liquid, for example water. The liquid outlet 108 is connectable to a return line such as the hot liquid line 18 for returning the liquid that, in operation, has absorbed heat from an airflow passing through the frame 102. The continuous internal conduit 104 forms a plurality of interconnected parallel sections 110 that extend within the frame 102.

The liquid inlet 106 is connected to a first interconnected parallel section 110. Each interconnected parallel section 110, except a last one, is connected to a next interconnected parallel section 110 via a generally U-shaped section 112 of the continuous internal conduit 104. The last interconnected parallel section 110 is connected to the liquid outlet 108. Liquid received at the liquid inlet 106 flows within the continuous internal conduit 104 in the direction shown by the various arrows until it reaches the liquid outlet 108. Heat from the air flowing through the frame 102 of the air-liquid heat exchanger 100 is absorbed at least in part by the liquid flowing through the continuous internal conduit 104.

The single-flow heat exchanger 100 is thin, especially when compared to a thickness of the server rack 10. Given its thinness, the single-flow heat exchanger 100 adds little to the overall space occupancy of the server rack 10 in the data center. The thinness of the single-flow heat exchanger 100 further allows its mounting on the server rack 10 by use of hinges (not shown) so that the single-flow heat exchanger 100 may be moved aside, as when opening a door, to provide access to components present in the backplane 20 of the rack 10.

The frame 102 occupies most of the overall width of single-flow heat exchanger 100, as only the generally U-shaped section 112 of the continuous internal conduit 104 protrude on each side of the frame 102. Consequently, the single-flow heat exchanger 100 offers a broad surface that may be traversed by a flow of air expelled from the server rack 10.

FIG. 3 is a visual representation of a stratified temperature pattern of an airflow expelled from the single-flow air-liquid heat exchanger of FIG. 2. A diagram 150 illustrates a temperature of a flow of air measured in an experimental setup, before and after passing through the single-flow heat exchanger 100. The air flows in the direction of arrows 152 and 154. In a first zone 156 upstream of the air-liquid heat exchanger 100, a temperature of the airflow is high due to the generation of heat in the server rack 10, being for example at about 40 degrees. The temperature of the airflow is substantially uniform within the first zone 156. Cold water is received at the bottom 158 of the single-flow heat exchanger 100, at a temperature of about 25 degrees. Lower strata 160 of the air flowing in a zone 162 downstream of the single-flow heat exchanger 100 are cooled to about 33 degrees. A temperature of the water flowing through the single-flow heat exchanger 100 increases as it passes through the various interconnected parallel sections 110, being continuously exposed to the 40 degrees airflow. The water reaches about 28 degrees the top 164 of the single-flow heat exchanger 100. Consequently, a topmost section of the single-flow heat exchanger 100 is less efficient in cooling the flow of air in upper strata 166, which are only cooled to about 36 degrees.

This lack of homogeneity of the flow of air expelled from the single-flow heat exchanger 100 causes a plurality of problems.

One problem is that it becomes difficult to place a plurality of server racks 10 in close proximity to one another because the air expelled from a first server rack 10 and aspired by the fans 12 of a second, proximally located server rack 10, is not suitable for efficiently cooling of that second server rack 10. This is particularly the case when it is desired to place a plurality of server racks 12 in front of one another, with the same orientation.

Another problem relates to the monitoring of cooling efficiency. Such monitoring is important as safety measures may need to be applied without delay in case of cooling failure. In the data center, temperature sensors (not shown) are positioned in various places on the server racks 10. When such temperature sensors are mounted on the single-flow heat exchangers 100, slight variations in the placement of these temperatures sensors on the surface of each single-flow heat exchanger 100 may lead to imprecisions that are detrimental to the overall monitoring of the cooling performance. For example when the interconnected parallel sections 110 extend horizontally, as illustrated on FIG. 2, positioning a temperature sensor at different heights on various single-flow heat exchanger 100 may cause to acquire inconsistent measurements.

FIG. 4 is a schematic diagram of a multi-flow air-liquid heat exchanger. A multi-flow air-liquid heat exchanger 200 comprises a frame 202, a liquid inlet 204 and a liquid outlet 206. The liquid inlet 204 is connected to a first manifold 208 and the liquid outlet 206 is connected to a second manifold 210. The first and second manifolds 208 and 210 are sometimes collectively called a "nurse" because the first manifold 208 feeds a cold liquid received at the liquid inlet 204 to a first plurality of parallel internal conduits 212, each of which is connected to one of a second plurality of parallel internal conduits 214 via a respective U-shaped link 216, the parallel internal conduits 214 being connected to the liquid outlet 206 via the second manifold 210. The first and second manifolds 208 and 210 as illustrated are located outside of the frame 202 and are positioned in an area where an airflow from the server rack 10 is substantially blocked. The first and second manifolds 208 and 210 usually have a diameter that is significantly larger than a diameter of the parallel internal conduits 212 and 214 in order for each of the parallel internal conduits 212 and 214 to be fed with substantially equal liquid flows.

When compared to the single-flow heat exchanger 100, multi-flow air-liquid heat exchanger 200 is much less subject to cause a temperature stratification of air flowing therethrough. The multi-flow air-liquid heat exchanger 200 however brings other disadvantages.

FIG. 5 is a schematic side-view of the multi-flow air-liquid heat exchanger of FIG. 4. On FIG. 5, the air expelled from the server rack 10 flows in a direction of the arrow 220. The frame 202 has an important thickness due to the presence of the first and second manifolds 208 and 210. This thickness may become problematic when mounting a large number of multi-flow air-liquid heat exchangers 200 on a respectively large number of server racks 10 in the data center. A same number of server racks 10 will occupy more of the floor space of the data center. It may be noted that the multi-flow air-liquid heat exchanger as illustrated on FIGS. 4 and 5 is only a simple example of many possible configurations.

Another disadvantage of the multi-flow air-liquid heat exchanger 200, which is also caused by its thickness, is that it cannot conveniently be mounted on the server rack 10 by use of hinges. The multi-flow air-liquid heat exchanger 200 needs to be fully dismounted from the server rack 10 to provide access to the backplane 20.

A further disadvantage of the multi-flow air-liquid heat exchanger 200 relates to its geometry. The nurse formed by the first and second manifolds 208 and 210 occupies a significant share of the overall surface of the multi-flow air-liquid heat exchanger 200, leaving a lesser share of this overall surface that be traversed by a flow of air expelled from the server rack 10, when compared with the single-flow heat exchanger 100.

In addition to the above-mentioned concerns, other concerns relate to the potential failure of cooling equipment, for example due to blockage of liquid conduits. The single-flow heat exchanger 100 and multi-flow air-liquid heat exchanger 200 each have a single inlet 106 or 204 and a single outlet 108 or 206, so any blockage of at the level of these inlets and outlets may lead to a complete loss of cooling of the airflow expelled from the server rack 10.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) lack of homogeneity of the flow of air expelled from a single-flow heat exchanger 100; (2) space occupancy of cooling equipment; and/or (3) potential failure of cooling equipment.

In one aspect, various implementations of the present technology provide a cooling arrangement for a rack hosting electronic equipment and at least one fan. The cooling arrangement is characterized in that it comprises:

a first air-liquid heat exchanger mounted to the rack so that heated air expelled from the rack by the at least one fan flows through the first air-liquid heat exchanger, the first air-liquid heat exchanger comprising a first frame, a first liquid inlet mounted to the first frame and adapted to receive liquid from a first cold supply line, a first liquid outlet mounted to the first frame and adapted to return liquid to a first hot return line, and a first continuous internal conduit forming a first plurality of interconnected parallel sections extending within the first frame, the first continuous internal conduit connecting the first liquid inlet to the first liquid outlet; and a second air-liquid heat exchanger mounted to the first air-liquid heat exchanger so that air having flowed through the first air-liquid heat exchanger flows through the second air-liquid heat exchanger, the second air-liquid heat exchanger comprising a second frame, a second liquid inlet mounted to the second frame and adapted to receive liquid from the first cold supply line or from a second cold supply line, a second liquid outlet mounted to the second frame and adapted to return liquid to the first hot return line or to a second hot return line, and a second continuous internal conduit forming a second plurality of interconnected parallel sections extending within the second frame, the second continuous internal conduit connecting the second liquid inlet to the second liquid outlet;

wherein the first frame is parallel and adjacent to the second frame, and one of the first plurality of interconnected parallel sections of the first continuous internal conduit nearest to the first liquid inlet is proximate one of the second plurality of interconnected parallel sections of the second continuous internal conduit nearest to the second liquid outlet.

In some implementations of the present technology, the first and second air-liquid heat exchangers are assembled in an anti-parallel configuration.

In some implementations of the present technology, an airflow between the first and second air-liquid heat exchangers has a heterogeneous temperature profile; and the same airflow having passed through the second air-liquid heat exchanger has a substantially homogeneous temperature profile.

In some implementations of the present technology, the first liquid inlet and the first liquid outlet are connected on a same side of the first frame; and the second liquid inlet and the second liquid outlet are connected on a same side of the second frame.

In some implementations of the present technology, the first liquid inlet and the first liquid outlet are connected on opposite sides of the first frame; and the second liquid inlet and the second liquid outlet are connected on opposite sides of the second frame.

In some implementations of the present technology, the first liquid inlet and the second liquid inlet are located on a same side of the cooling arrangement.

In some implementations of the present technology, the first liquid inlet and the second liquid inlet are located on opposite sides of the cooling arrangement.

In some implementations of the present technology, the first and second pluralities of interconnected parallel sections of the first and second continuous internal conduits extend horizontally.

In some implementations of the present technology, the first and second pluralities of interconnected parallel sections of the first and second continuous internal conduits extend vertically.

In some implementations of the present technology, a first one of the first plurality of interconnected parallel sections is connected to the first liquid inlet; each one of the first plurality of interconnected parallel sections except a last one of the first plurality of interconnected parallel sections is connected to a next one of the first plurality of interconnected parallel sections via one of a first plurality of U-shaped sections of the first continuous internal conduit; the last one of the first plurality of interconnected parallel sections is connected to the first liquid outlet; a first one of the second plurality of interconnected parallel sections is connected to the second liquid inlet; each one of the second plurality of interconnected parallel sections except a last one of the second plurality of interconnected parallel sections is connected to a next one of the second plurality of interconnected parallel sections via one of a second plurality of U-shaped sections of the second continuous internal conduit; and the last one of the second plurality of interconnected parallel sections is connected to the second liquid outlet.

In some implementations of the present technology, the first air-liquid heat exchanger is a first dual-flow air-liquid heat exchanger further comprising a third continuous internal conduit forming a third plurality of interconnected parallel sections extending within the first frame, the third continuous internal conduit connecting the first liquid inlet to the first liquid outlet; and the second air-liquid heat exchanger is a second dual-flow air-liquid heat exchanger further comprising a fourth continuous internal conduit forming a fourth plurality of interconnected parallel sections extending within the second frame, the fourth continuous internal conduit connecting the second liquid inlet to the second liquid outlet.

In some implementations of the present technology, a first portion of the first plurality of interconnected parallel sections is located in a first plane within the first frame; a second portion of the first plurality of interconnected parallel sections is located in a second plane within the first frame, the second plane being parallel to the first plane; a first portion of the third plurality of interconnected parallel sections is located in the second plane within the first frame; a second portion of the third plurality of interconnected parallel sections is located in the first plane within the first frame; a first portion of the second plurality of interconnected parallel sections is located in a third plane within the second frame; a second portion of the second plurality of interconnected parallel sections is located in a fourth plane within the second frame, the fourth plane being parallel to the third plane; a first portion of the fourth plurality of interconnected parallel sections is located in the fourth plane within the second frame; and a second portion of the fourth plurality of interconnected parallel sections is located in the third plane within the second frame.

In some implementations of the present technology, the cooling arrangement further comprises the first cold supply line; and the first hot return line.

In some implementations of the present technology, the first cold supply line and the first hot return line are connected to a secondary cooling system for the rack.

In some implementations of the present technology, the cooling arrangement further comprises the second cold supply line; and the second hot return line.

In some implementations of the present technology, the first cold supply line, the second cold supply line, the first hot return line and the second hot return line are connected to a secondary cooling system for the rack In some implementations of the present technology, each one of the first and second air-liquid heat exchangers is configured to reduce a temperature of the air expelled from the rack to less than a maximum rated air temperature when the other one of the first and second air-liquid heat exchangers is taken out of service.

In some implementations of the present technology, the cooling arrangement further comprises a pair of hinges mounted on a lateral side of the first frame, the hinges being adapted for pivotally mounting the cooling arrangement on the rack.

In some implementations of the present technology, the cooling arrangement further comprises a temperature sensor mounted on an external face of the second air-liquid heat exchanger and adapted to transmit a temperature of air having flowed through the first and second air-liquid heat exchangers to a remote monitoring device.

In the context of the present specification, unless expressly provided otherwise, electronic equipment may refer, but is not limited to, "servers", "electronic devices", "operation systems", "systems", "computer-based systems", "controller units", "monitoring devices", a "control devices" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIGS. 6A, 6B and 6C are highly schematic representations of pairs of air-liquid heat exchangers assembled in anti-parallel configurations in accordance with an embodiment of the present technology;

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

Figure 4:
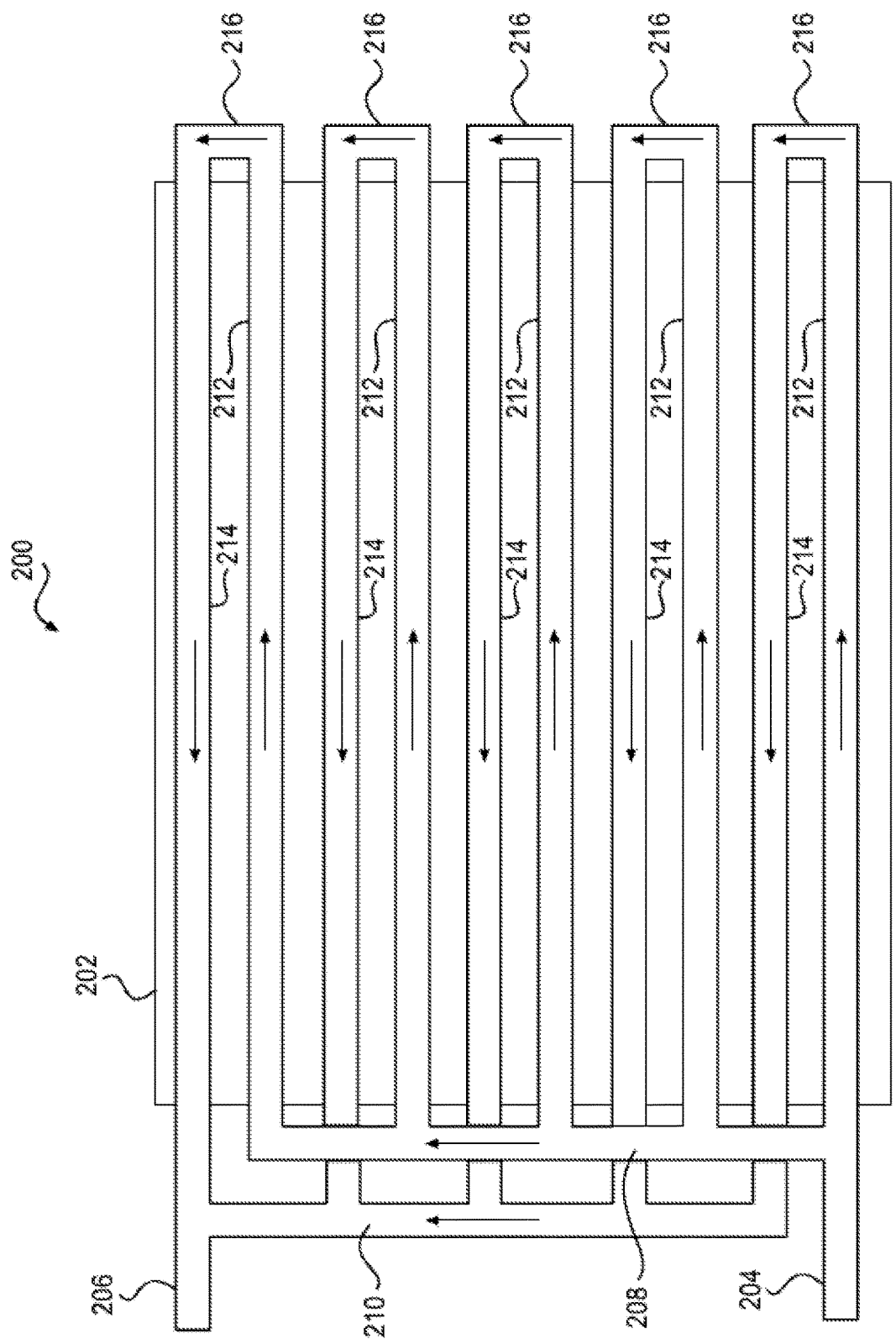
FIG. 4 is a schematic diagram of a multi-flow air-liquid heat exchanger.
Figure 5:
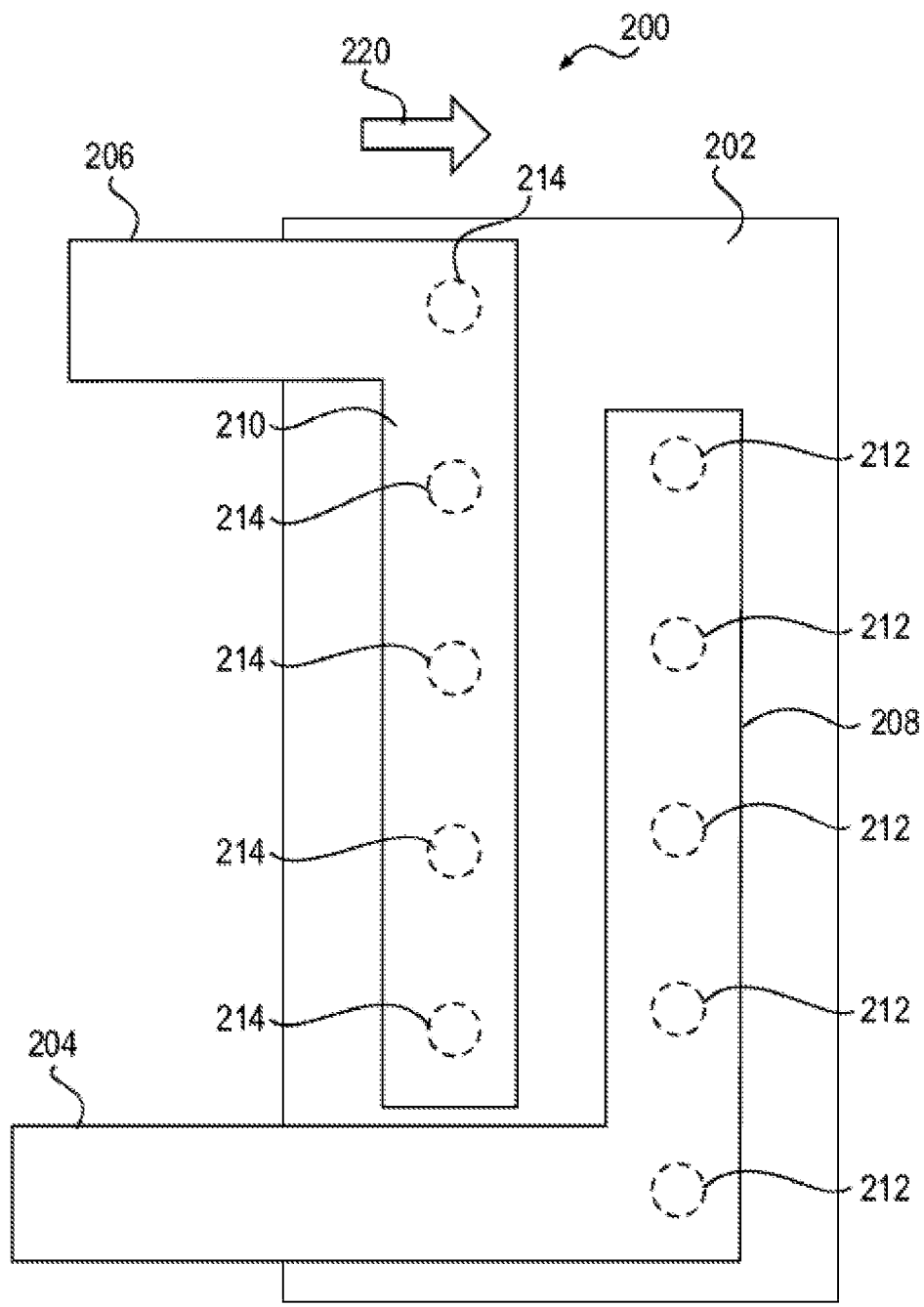
FIG. 5 is a schematic side-view of the multi-flow air-liquid heat exchanger of FIG. 4.

In an aspect, the present technology reduces or eliminates the problems related to the stratification of the airflow temperature expelled from air-liquid heat exchangers. Two (2) equivalent air-liquid heat exchangers are mounted in series on a rack so that air expelled from the rack by fans mounted within the rack flow through both air-liquid heat exchangers. The air-liquid heat exchangers are mounted in anti-parallel fashion. For instance, a cold liquid such as water is fed to a first air-liquid heat exchanger though a top-mounted inlet and flows through horizontal parallel conduits until it reaches a bottom-mounted outlet. Air expelled from the rack and flowing through the first air-liquid heat exchanger does have a stratified temperature pattern. However, the same air flows through a second air-liquid heat exchanger having an anti-parallel stance from the first air-liquid heat exchanger. Cold water or another cooling liquid is fed to a bottom-mounted inlet of this second air-liquid heat exchanger and flows through horizontal parallel conduits until it reaches a top-mounted outlet. In this way, hotter air strata expelled from the first air-liquid heat exchanger are exposed to those of the horizontal parallel conduits of the second air-liquid heat exchanger that are closest to the bottom-mounted inlet. Airflow expelled from the second air-liquid heat exchanger thus has a substantially homogeneous temperature pattern. A combination of the two air-liquid heat exchangers has a thickness as measured along the path of the airflow that is less than that of a conventional multi-flow air-liquid heat exchanger, as illustrated on FIGS. 4 and 5, this combination also providing a broader surface adapted for being traversed by the airflow, when compared with the conventional multi-flow air-liquid heat exchanger.

With these fundamentals in place, we will now consider some non-limiting examples to illustrate various implementations of aspects of the present technology.

Figure 6A:
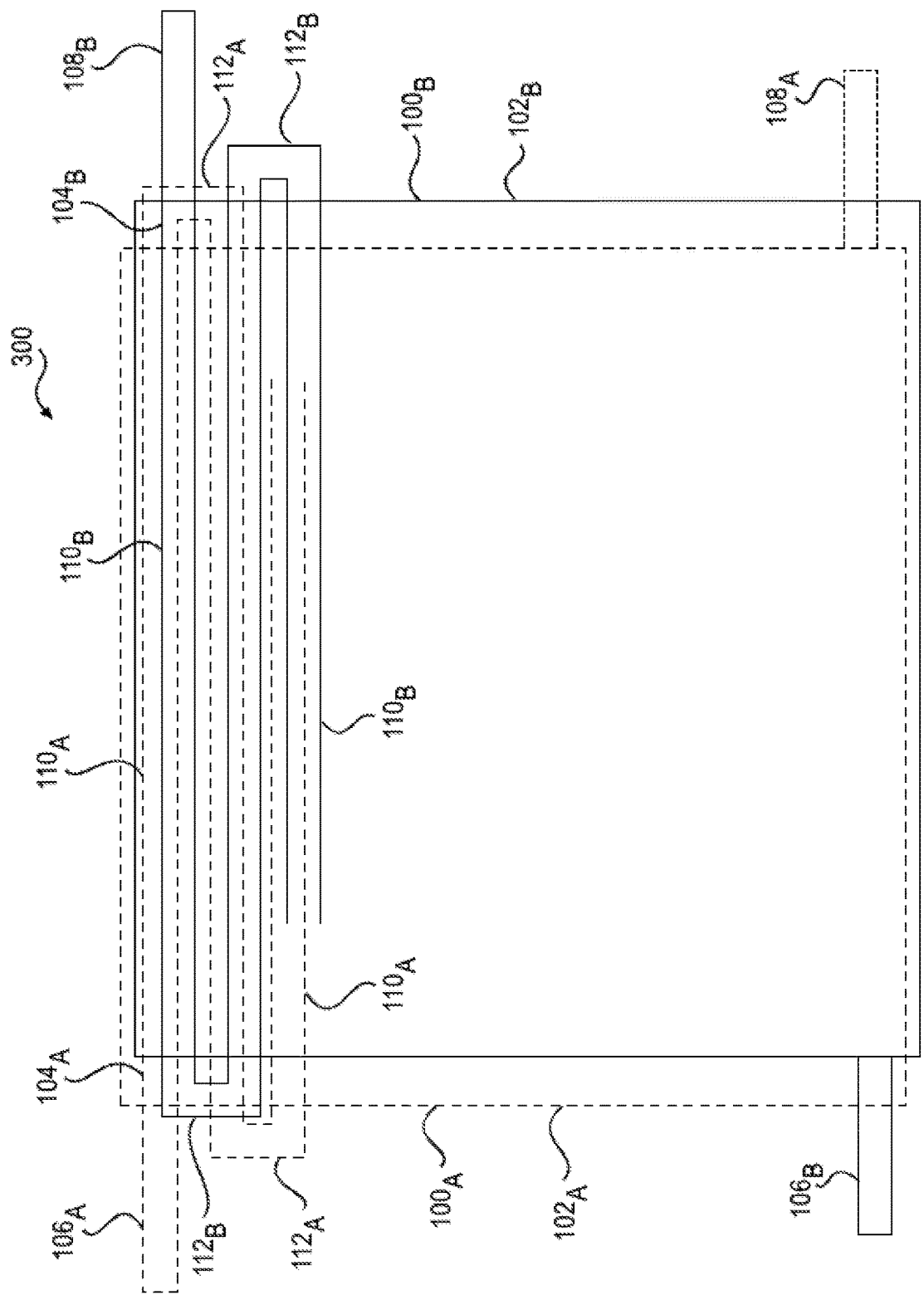
Figure 6C:
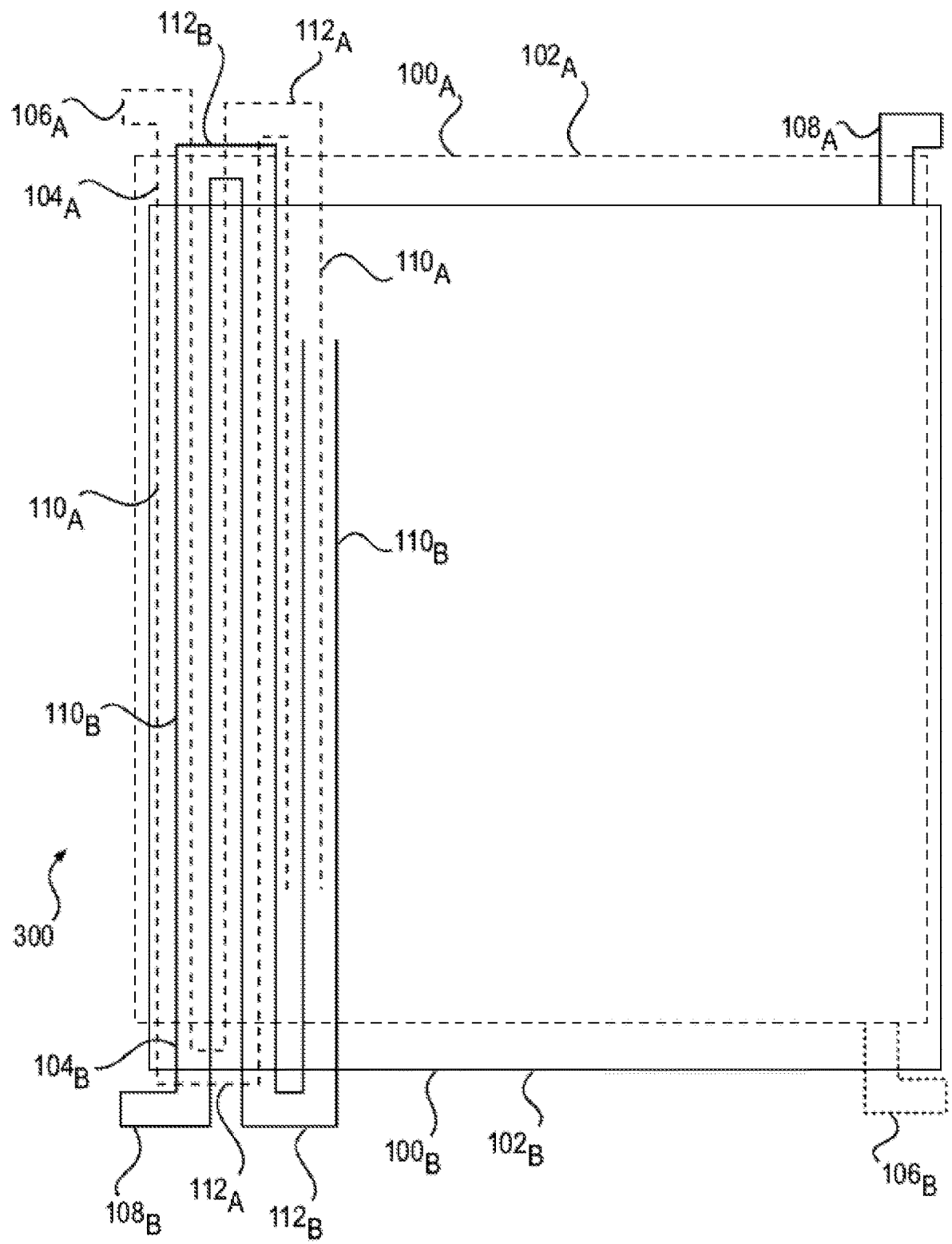

FIGS. 6A, 6B and 6C are highly schematic representations of pairs of air-liquid heat exchangers assembled in anti-parallel configurations in accordance with an embodiment of the present technology. A cooling arrangement 300 that may be mounted on a rack hosting electronic equipment and at least one fan, for example the server rack 10 having the fans 12, comprises at least a pair of air-liquid heat exchangers, for example and without limitation, a pair of single-flow heat exchangers 100 as introduced in the description of FIG. 2. With continued reference to FIGS. 6A, 6B and 6C, also considering FIGS. 1 and 2, a first air-liquid heat exchanger $100_A$ is shown in dotted lines and a second air-liquid heat exchanger $100_B$ is shown in solid lines. On FIGS. 6A, 6B and 6C, the first and second air-liquid heat exchangers $100_A$ and $100_B$ are shown as being mounted at an offset from one another; this illustration is solely intended to render visible various parts of the first and second air-liquid heat exchangers $100_A$ and $100_B$. In a practical application, the first and second air-liquid heat exchangers $100_A$ and $100_B$ may be aligned so that there is no discernable offset therebetween.

The first air-liquid heat exchanger $100_A$ is mounted to the server rack 10 so that heated air expelled from the server rack 10 by the one or more fans 12 flows through the first air-liquid heat exchanger $100_A$. The first air-liquid heat exchanger $100_A$ comprises a first frame $102_A$, a first liquid inlet $106_A$ mounted to the first frame $102_A$ for receiving liquid from a cold supply line, a first liquid outlet $108_A$ mounted to the first frame 102 for returning liquid to a hot return line, and a first continuous internal conduit $104_A$. The first continuous internal conduit $104_A$ forms a first plurality of interconnected parallel sections $110_A$ (only some are shown) extending within the first frame $102_A$. Examples of the cold supply line and of the hot return line are shown on later Figures.

The first continuous internal conduit $104_A$ connects the first liquid inlet $106_A$ to the first liquid outlet $108_A$. In more details, a first one of the first plurality of interconnected parallel sections $110_A$ is connected to the first liquid inlet $106_A$. Then, each one of the first plurality of interconnected parallel sections $110_A$ except a last one is connected to a next one of the first plurality of interconnected parallel sections $110_A$ via one of a first plurality of U-shaped sections $112_A$ of the first continuous internal conduit $104_A$. The last one of the first plurality of interconnected parallel sections $110_A$ is connected to the first liquid outlet $108_A$.

The second air-liquid heat exchanger $100_B$ is mounted to the first air-liquid heat exchanger $100_A$ so that air having flowed through the first air-liquid heat exchanger $100_A$ flows through the second air-liquid heat exchanger $100_B$. The second air-liquid heat exchanger $100_B$ comprises a second frame $102_B$, a second liquid inlet $106_B$ mounted to the second frame $102_B$ and adapted to receive liquid from the same cold supply line or from another cold supply line, a second liquid outlet $108_B$ mounted to the second frame $102_B$ and adapted to return liquid to the same hot return line or to another hot return line, and a second continuous internal conduit $104_B$ forming a second plurality of interconnected parallel sections $110_B$ (only some are shown) extending within the second frame $102_B$.

The second continuous internal conduit $104_B$ connects the second liquid inlet $106_B$ to the second liquid outlet $108_B$. In more details, a first one of the second plurality of interconnected parallel sections $110_B$ is connected to the second liquid inlet $106_B$. Then, each one of the second plurality of interconnected parallel sections $110_B$ except a last one is connected to a next one of the second plurality of interconnected parallel sections $110_B$ via one of a second plurality of U-shaped sections $112_B$ of the second continuous internal conduit $104_B$. The last one of the second plurality of interconnected parallel sections $110_B$ is connected to the second liquid outlet $108_B$. The first and second air-liquid heat exchangers ($100_A$, $100_B$) are assembled in an anti-parallel configuration in the sense that liquid flows in opposite directions in their respective liquid parallel sections (110A, 110B).

FIG. 6A illustrates a particular configuration in which the liquid inlet $106_A$ and the liquid outlet $108_A$ are connected on opposite sides of the frame $102_A$, the first continuous internal conduit $104_A$ forming an even number of interconnected parallel sections $110_A$ while the second continuous internal conduit $104_B$ forms an even number of interconnected parallel sections $110_B$. Likewise, the liquid inlet $106_B$ and the liquid outlet $108_B$ are connected on opposite sides of the frame $102_B$. As illustrated, the interconnected parallel sections $110_A$ and $110_B$ extend horizontally. This is just one of many possible configurations. For instance, the interconnected parallel sections $110_A$ and $110_B$ may extend vertically, as shown on FIG. 6C. Some other configurations will be illustrated hereinbelow.

The first and second air-liquid heat exchangers $100_A$ and $100_B$ are mounted to the server rack 10 so that the first frame $102_A$ is parallel and adjacent to the second frame $102_B$. One of the first plurality of interconnected parallel sections $110_A$ of the first continuous internal conduit $104_A$ nearest to the first liquid inlet $106_A$ is proximate one of the second plurality of interconnected parallel sections $110_B$ of the second continuous internal conduit $104_B$ nearest to the second liquid outlet $108_B$. Otherwise stated, among the first plurality of interconnected parallel sections $110_A$, the one interconnected parallel section $110_A$ that is closest to the first liquid inlet $106_A$ is also the one interconnected parallel section $110_A$ that is closest to the one interconnected parallel section $110_B$ that is closest to the second liquid outlet $108_B$.

The one of the first plurality of interconnected parallel sections $110_A$ of the first continuous internal conduit $104_A$ nearest to the first liquid inlet $106_A$ and the one of the second plurality of interconnected parallel sections $110_B$ of the second continuous internal conduit $104_B$ nearest to the second liquid outlet $108_B$ may be directly facing each other when viewed in a general direction of an airflow expelled from the server rack 10. Alternatively, one of these first parallel sections $110_A$ or $110_B$ may be positioned slightly higher or lower than the other. Precise placement of the one of the first plurality of interconnected parallel sections $110_A$ of the first continuous internal conduit $104_A$ nearest to the first liquid inlet $106_A$ in relation to the proximate one of the second plurality of interconnected parallel sections $110_B$ of the second continuous internal conduit $104_B$ nearest to the second liquid outlet $108_B$ may depend on the construction of the first and second air-liquid heat exchangers $100_A$ and $100_B$ and on manufacturing tolerances. Minor variations on the placement of the parallel sections $110_A$ and $110_B$ within the cooling arrangement 300 are not expected to have a significant impact on the cooling performance.

Given any one of these configurations, a topmost strata of the airflow expelled from the server rack 10 flows within the first air-liquid heat exchanger $100_A$ around its topmost interconnected parallel sections $110_A$ in which the liquid flowing through the continuous internal conduit $104_A$ is coolest, being closest to the first liquid inlet $106_A$. The topmost strata of the airflow then flows within the second air-liquid heat exchanger $100_B$ around its topmost interconnected parallel sections $110_B$ in which the liquid flowing through the continuous internal conduit $104_B$ is warmest, being closest to the second liquid outlet $108_B$. Conversely, a bottommost strata of the airflow expelled from the server rack 10 flows within the first air-liquid heat exchanger $100_A$ around its bottommost interconnected parallel sections $110_A$ in which the liquid flowing through the continuous internal conduit $104_A$ is warmest, being closest to the first liquid outlet $108_A$. The bottommost strata of the airflow then flows within the second air-liquid heat exchanger $100_B$ around its bottommost interconnected parallel sections $110_B$ in which the liquid flowing through the continuous internal conduit $104_B$ is coolest, being closest to the second liquid inlet $106_B$. An equivalent result may be obtained by positioning the first liquid inlet $106_A$ and the second liquid outlet $108_B$ at the bottom of the cooling arrangement 300, also positioning the first liquid outlet $108_A$ and the second liquid inlet $106_B$ at the top of the cooling arrangement 300. Rotating the cooling arrangement 300 so that the interconnected parallel sections $110_A$ and $110_B$ extend vertically is also contemplated.

This effect is spread to all strata of the airflow, each of which gradually receive less cooling from the first air-liquid heat exchanger $100_A$ along their distribution from the topmost strata toward the bottommost strata, gradually receiving more cooling from the second air-liquid heat exchanger $100_B$ along the same distribution.

Figure 1:
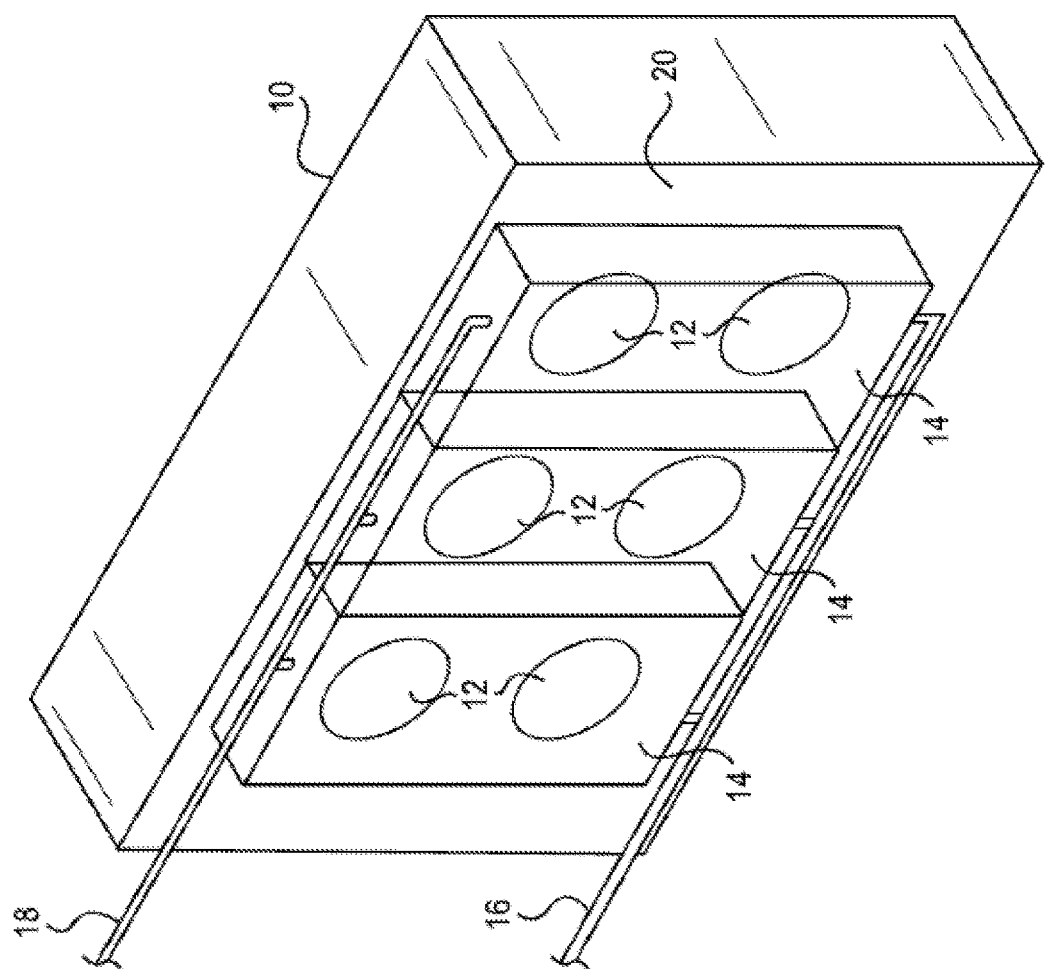
FIG. 1 is a highly schematic perspective view of a server rack on which three (3) air-liquid heat exchangers are mounted.
Figure 2:
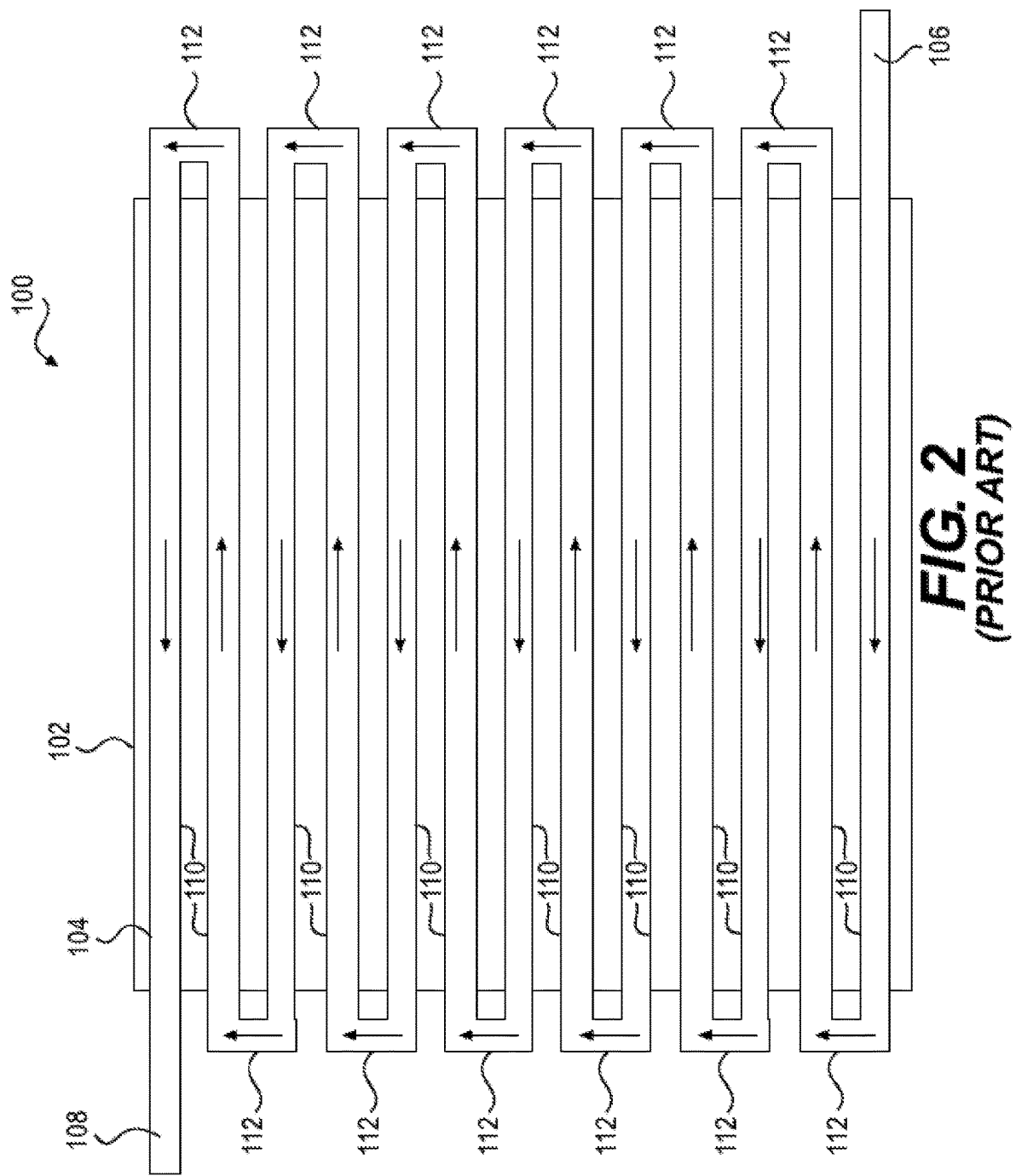
FIG. 2 is a schematic diagram of a single-flow air-liquid heat exchanger.
Figure 7:
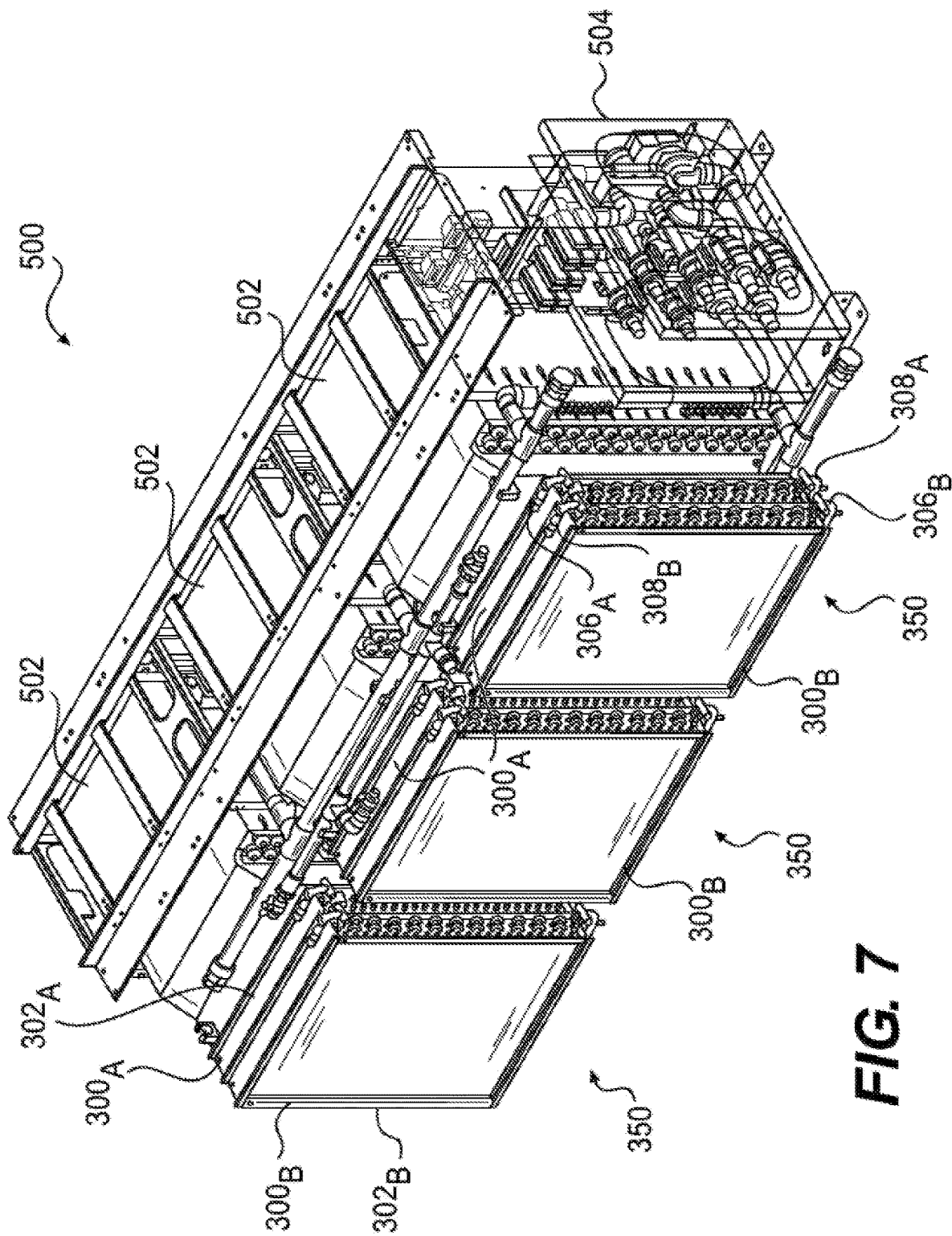
FIG. 7 is a perspective view of a server rack on which pairs of dual-flow air-liquid heat exchangers are mounted in an anti-parallel configuration in accordance with an embodiment of the present technology.
Figure 8:
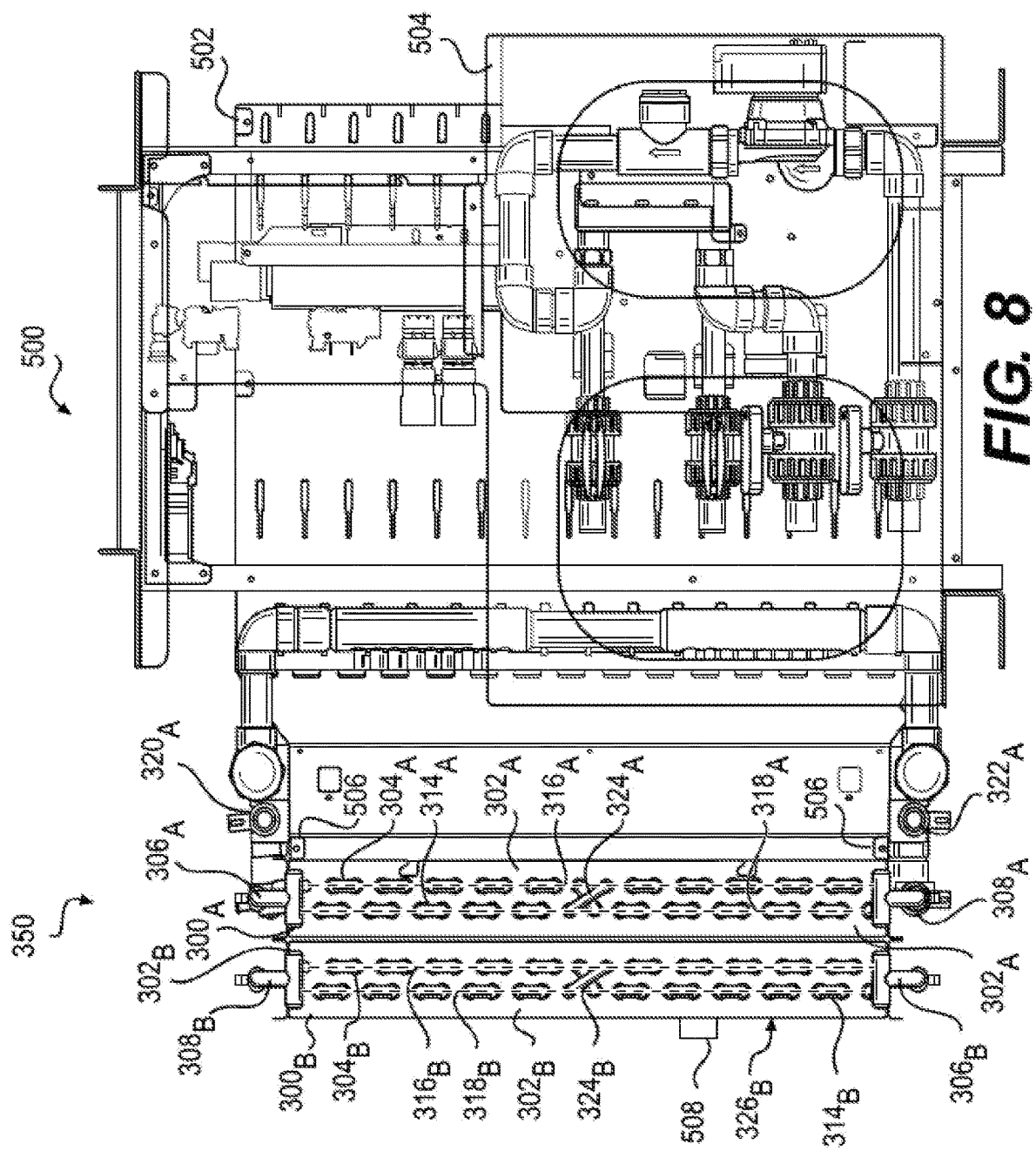
FIG. 8 is a side elevation view of the server rack of FIG. 7 in accordance with an embodiment of the present technology.

FIG. 7 is a perspective view of a server rack on which pairs of dual-flow air-liquid heat exchangers are mounted in an anti-parallel configuration in accordance with an embodiment of the present technology. FIG. 8 is a side elevation view of the server rack of FIG. 7 in accordance with an embodiment of the present technology. A server rack 500 has a plurality of server housings 502 (three are shown), each of which includes at least one fan 12 (FIG. 1). A cooling arrangement 350 is mounted on each of the server housings 502, each cooling arrangement 350 including first and second dual-flow air-liquid heat exchangers $300_A$ and $300_B$. These dual-flow air-liquid heat exchangers $300_A$ and $300_B$ represent a modest increase in size, particularly an increased thickness, when compared to the single-flow heat exchangers 100 used in the configurations of FIGS. 6A, 6B and 6C. They however provide a large increase in cooling efficiency while remaining significantly thinner than the multi-flow air-liquid heat exchanger 200 of FIG. 4.

The fan or fans 12 contained within each server housing 502 provide forced air cooling to the equipment mounted in the server housings 502 and generate an airflow directed toward the corresponding cooling arrangements 350. Within each cooling arrangement 350, each one of the first and second dual-flow air-liquid heat exchangers $300_A$ and $300_B$ may be configured to provide sufficient redundancy of the cooling capacity, each one of the first and second dual-flow air-liquid heat exchangers $300_A$ and $300_B$ being able to reduce a temperature of the air expelled from the rack 10 or 500 to less than a maximum rated air temperature to maintain a safe operating temperature of the corresponding server housing 502 on which it is mounted when the other one of the first and second dual-flow air-liquid heat exchangers $300_A$ and $300_B$ is taken out of service for maintenance or as a result from an equipment failure.

The server rack 500 may also include a secondary cooling system 504 mounted on its lateral side. The secondary cooling system 504 may include one or more of a liquid cooling system or a two-phase cooling system including waterblocks, cold plates and/or evaporators and liquid condensers (not shown) mounted on heat-generating components (not shown) within the server rack 500.

On FIGS. 7 and 8, a liquid inlet $306_A$ and a liquid outlet $308_A$ are connected on a same side of a frame $302_A$, and a liquid inlet $306_B$ and a liquid outlet $308_B$ are connected on a same side of the frame $302_B$. Additionally, the liquid inlets $306_A$ and $306_B$ are located on a same side of the cooling arrangement 350. An alternate configuration in which the liquid inlets $306_A$ and $306_B$ are located on opposite sides of the cooling arrangement 350 is also contemplated.

As best seen on FIG. 8, in a particular non-limiting configuration, the first dual-flow air-liquid heat exchanger $300_A$ comprises a first continuous internal conduit $304_A$ forming a first plurality of interconnected parallel sections (not shown) and a third continuous internal conduit $314_A$ forming a third plurality of interconnected parallel sections (not shown). The first and third pluralities of interconnected parallel sections extend within the first frame $302_A$. The first and third continuous internal conduits $304_A$ and $314_A$ connect the first liquid inlet $306_A$ to the first liquid outlet $308_A$.

Likewise, the second dual-flow air-liquid heat exchanger $300_B$ comprises a second continuous internal conduit $304_B$ forming a second plurality of interconnected parallel sections (not shown) and a fourth continuous internal conduit $314_B$ forming a fourth plurality of interconnected parallel sections (not shown), the second and fourth pluralities of interconnected parallel sections extending within the second frame $302_B$. The second and fourth continuous internal conduits $304_N$ and $314_B$ connect the second liquid inlet $306_B$ to the second liquid outlet $308_B$.

As illustrated, a first portion of the first plurality of interconnected parallel sections is located in a first plane (vertical dashed line $316_A$) within the first frame $302_A$ and a second portion of the first plurality of interconnected parallel sections is located in a second plane (vertical dashed line $318_A$) within the first frame $302_A$, the second plane $318_A$ being parallel to the first plane $316_A$. Conversely, a first portion of the third plurality of interconnected parallel sections is located in the second plane $318_A$ within the first frame $302_A$ and a second portion of the third plurality of interconnected parallel sections is located in the first plane $316_A$ within the first frame $302_A$. The third continuous internal conduit $314_A$ and the first continuous internal conduit $304_A$, both change between the first plane $316_A$ and the second plane $318_A$ at a crossing point $324_A$. Variants of the first dual-flow air-liquid heat exchanger $300_A$ may include one or more crossing points $324_A$ and may alternatively have no such crossing point.

Likewise, a first portion of the second plurality of interconnected parallel sections is located in a third plane (vertical dashed line $316_B$) within the second frame $302_B$ and a second portion of the second plurality of interconnected parallel sections is located in a fourth plane (vertical dashed line $318_B$) within the second frame $302_B$, the fourth plane $318_B$ being parallel to the third plane $316_B$. Conversely, a first portion of the fourth plurality of interconnected parallel sections is located in the fourth plane $318_B$ within the second frame $302_B$ and a second portion of the fourth plurality of interconnected parallel sections is located in the third plane $316_B$ within the second frame $302_B$. The fourth continuous internal conduit $314_B$ and the second continuous internal conduit $304_B$, both change between the third plane $316_B$ and the fourth plane $318_B$ at a crossing point $324_B$. Variants of the second dual-flow air-liquid heat exchanger $300_B$ may include one or more crossing points $324_B$ and may alternatively have no such crossing point. The first and second dual-flow air-liquid heat exchangers $300_A$, $300_B$ of the cooling arrangement 350 may have different numbers of crossing points $324_A$ or $324_B$.

As best seen on FIG. 8, the liquid inlet $306_A$ of each cooling arrangement 350 is connected to a first cold supply line $320_A$ and the liquid outlet $308_A$ of each cooling arrangement 350 is connected to a first hot return line $322_A$. Although not shown, the liquid inlet $306_B$ of each cooling arrangement 350 may be connected to the first cold supply line $320_A$ or to another cold supply line (not shown), and the liquid outlet $308_B$ of each cooling arrangement 350 may be connected to the first hot return line $322_A$ or to another hot return line (not shown). The first cold supply line $320_A$ and the first hot return line $322_A$, as well as the other cold supply line and the hot return line, if present, may be also be connected to the secondary cooling system 504 for the server rack 500. A pump (not shown) provides a continuous flow of cold liquid delivered to the cooling arrangement 350 via the cold supply line or lines and retrieves heated liquid from the cooling arrangement 350 via the hot return line or lines. The pump transports the heated liquid toward further cooling equipment, for example cooling towers (not shown), located outside of the data center.

FIG. 8 also shows that the cooling arrangement 350 may be mounted on the server rack 500 by use of a pair of hinges 506 mounted on a lateral side of the first frame 302$_A$, the hinges 506 being adapted for pivotally mounting the cooling arrangement 350 on the rack 10. Optionally, additional hinges may be installed between the two hinges 506 as shown. The particular configuration of FIG. 8 shows that the hinges 506 are located on the same side of the cooling arrangement 350 where the liquid inlets 306$_A$, 306$_B$ and the liquid outlets 308$_A$, 308$_B$ are also located. This configuration facilitates pivoting of the cooling arrangement 350 about the hinges 350. Mounting the cooling arrangements 300 of FIGS. 6A, 6B and 6C on a rack using the hinges 506 is also contemplated.

Also shown on FIG. 8 is a temperature sensor 508 mounted on an external face 326$_B$ of the dual-flow second air-liquid heat exchanger 300$_B$. The temperature sensor 508 may measure and transmit a temperature of air having flowed through the first and second dual-flow air-liquid heat exchangers 300$_A$, 300$_B$ to a remote monitoring device (not shown). The server rack 500 may comprise a plurality of additional sensors (not shown) for providing various temperature, liquid flow, and pressure measurements to the remote monitoring device, the temperature sensor 508 and these additional sensors sharing a common communication link (not shown) for forwarding their measurements to the remote monitoring device. A position of the temperature sensor 508 on the external face 326$_B$ of the second dual-flow air-liquid heat exchanger 300$_B$ may vary horizontally and/or vertically, given that the temperature of the air having flowed through the first and second dual-flow air-liquid heat exchangers 300$_A$, 300$_B$ substantially homogeneous, as will be illustrated on FIG. 9. Mounting the temperature sensor 508 on an external face of the second air-liquid heat exchanger 100$_B$ of the cooling arrangement 300 is also contemplated.

Figure 9:
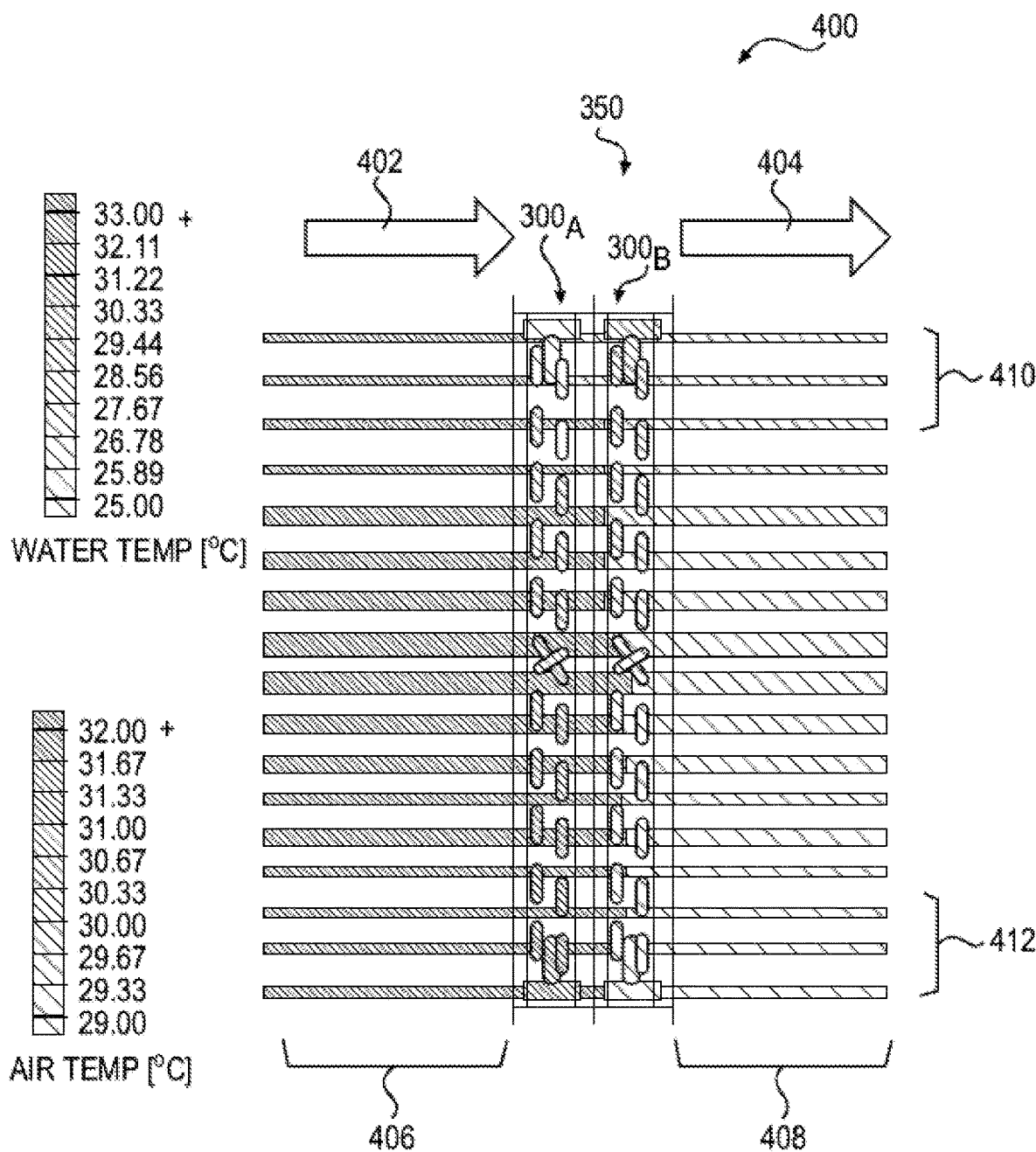
FIG. 9 is a visual representation of a homogeneous temperature pattern of an airflow expelled from dual-flow air-liquid heat exchangers assembled in an anti-parallel configuration in accordance with an embodiment of the present technology.

FIG. 9 is a visual representation of a homogeneous temperature pattern of an airflow expelled from dual-flow air-liquid heat exchangers assembled in an anti-parallel configuration in accordance with an embodiment of the present technology. A diagram 400 illustrates a temperature of a flow of air determined in a simulation environment, before and after passing through the cooling arrangement 350. The air flows in the direction of arrows 402 and 404. In a first zone 406 upstream of the cooling arrangement 350, a temperature of the airflow is high due to the generation of heat in the server rack 10, being for example at about 40 degrees. The temperature of the airflow is substantially uniform within the first zone 406. Cold water is received at the top of the first dual-flow air-liquid heat exchanger 300$_A$, at a temperature of about 25 degrees. Upper strata 410 of the air flowing downstream of the first dual-flow air-liquid heat exchanger 300$_A$ are cooled to about 30 degrees. A temperature of the water flowing through the first dual-flow air-liquid heat exchanger 300$_A$ increases as it passes through the various interconnected parallel sections 110$_A$, being continuously exposed to the 40 degrees airflow. The water reaches about 33 degrees the bottom of the first dual-flow air-liquid heat exchanger 300$_A$. Consequently, the airflow between the first and second dual-flow air-liquid heat exchangers 300$_A$, 300$_B$ has a stratified, heterogeneous temperature profile in which lower strata 412 of the air flowing downstream of the first dual-flow air-liquid heat exchanger 300$_A$ are only cooled to about 37 degrees.

The same airflow immediately reaches the second dual-flow air-liquid heat exchanger 300$_B$. Cold water is received at the bottom of the second dual-flow air-liquid heat exchanger 300$_B$, also at a temperature of about 25 degrees. Lower strata 412 of the airflow, which have been cooled to a limited extent to about 37 degrees when flowing through the dual-flow first air-liquid heat exchanger 300$_A$, receive maximum cooling from the dual-flow second air-liquid heat exchanger 300$_B$ and reach a temperature of about 30 degrees. Upper strata 410 of the airflow, which have been cooled to a larger extent to about 30 degrees when flowing through the first dual-flow air-liquid heat exchanger 300$_A$, receive a modest level of cooling from the second dual-flow air-liquid heat exchanger 300$_B$ to also reach a temperature of about 29 degrees. As a result, the same airflow having passed through the second dual-flow air-liquid heat exchanger 300$_B$ has a substantially homogeneous temperature profile and all strata of the airflow expelled from the cooling arrangement 350 in a zone 408 are at a substantially uniform temperature of about 30 degrees. The water also reaches about 29 degrees the top of the second dual-flow air-liquid heat exchanger 300$_B$.

Figure 3:
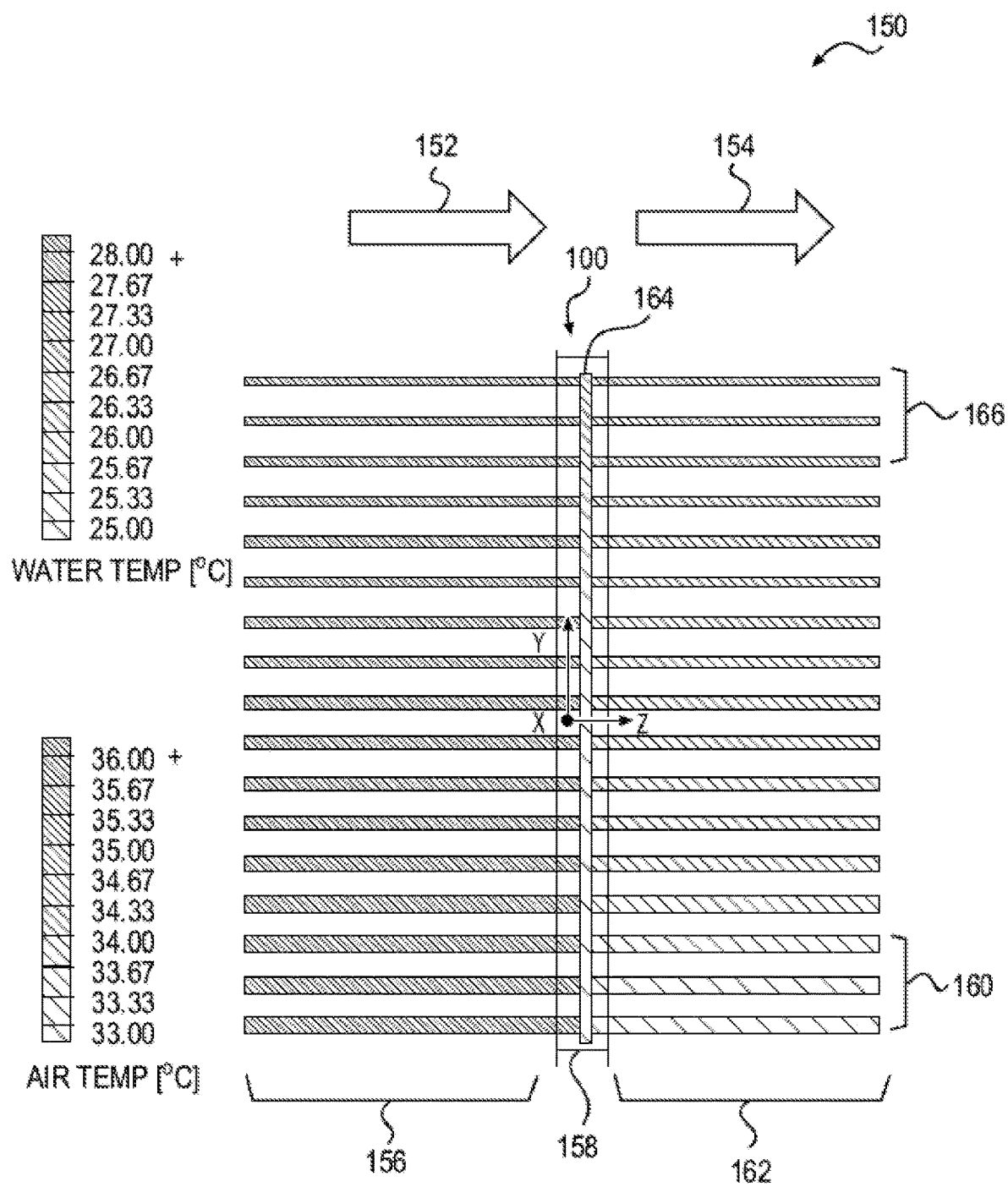
FIG. 3 is a visual representation of a stratified temperature pattern of an airflow expelled from the single-flow air-liquid heat exchanger of FIG. 2.

Referring again to FIG. 3, the diagram 150 illustrates results obtained when using the single-flow heat exchanger 100. In contrast, the diagram 400 illustrates results obtained when using a pair of dual-flow heat exchangers 300$_A$, 300$_B$. These results are not directly comparable due to the respective cooling capacities of these different heat exchangers. However, while the numerical absolute temperature values shown on FIGS. 3 and 9 cannot be directly compared, the difference in the airflow temperature patterns is striking: while FIG. 3 shows an important stratification of the temperature pattern, FIG. 9 shows uniformity and homogeneity of the temperature in all strata of the airflow expelled from the cooling arrangement 350. It may be noted that using a pair of single-flow heat exchangers mounted in anti-parallel fashion would arguably produce a lesser decrease of the airflow temperature, but would nevertheless provide homogeneity of the temperature in all strata of the resulting airflow. In contrast, using a single dual-flow heat exchanger would still result in a stratified, heterogeneous temperature profile of the resulting airflow.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling arrangement for a rack hosting electronic equipment and at least one fan, the cooling arrangement comprising:
   a first air-liquid heat exchanger unit mounted to the rack so that heated air expelled from the rack by the at least one fan flows through the first air-liquid heat exchanger unit, the first air-liquid heat exchanger unit comprising a first frame, a first liquid inlet mounted to the first frame and adapted to receive liquid from a first cold supply line, a first liquid outlet mounted to the first frame and adapted to return liquid to a first hot return line, and a first continuous internal conduit forming a first plurality of interconnected parallel sections extending within the first frame, the first continuous internal conduit connecting the first liquid inlet to the first liquid outlet; and a separate second air-liquid heat exchanger unit that is mounted to the first air-liquid heat exchanger unit so that air having flowed through the first air-liquid heat exchanger unit flows through the second air-liquid heat exchanger unit, the second air-liquid heat exchanger unit comprising a second frame, a second liquid inlet mounted to the second frame and adapted to receive liquid from the first cold supply line or from a second cold supply line, a second liquid outlet mounted to the second frame and adapted to return liquid to the first hot return line or to a second hot return line, and a second continuous internal conduit forming a second plurality of interconnected parallel sections extending within the second frame, the second continuous internal conduit connecting the second liquid inlet to the second liquid outlet;

wherein:

the mounting of the separate second air-liquid heat exchanger unit is arranged to have the second frame parallel and adjacent to the first frame, and one of the first plurality of interconnected parallel sections of the first continuous internal conduit nearest to the first liquid inlet is proximate one of the second plurality of interconnected parallel sections of the second continuous internal conduit nearest to the second liquid outlet;

the first air-liquid heat exchanger unit and the second air-liquid heat exchanger unit are assembled in an anti-parallel configuration;

an airflow between the first and second air-liquid heat exchanger units has a heterogeneous temperature profile; and the same airflow having passed through the second air-liquid heat exchanger unit has a substantially homogeneous temperature profile.

2. The cooling arrangement of claim 1, wherein:
the first liquid inlet and the first liquid outlet are connected on a same side of the first frame; and
the second liquid inlet and the second liquid outlet are connected on a same side of the second frame.

3. The cooling arrangement of claim 1, wherein the first liquid inlet and the second liquid inlet are located on a same side of the cooling arrangement.

4. The cooling arrangement of claim 1, wherein the first and second pluralities of interconnected parallel sections of the first and second continuous internal conduits extend horizontally.

5. The cooling arrangement of claim 1, wherein the first and second pluralities of interconnected parallel sections of the first and second continuous internal conduits extend vertically.

6. The cooling arrangement of claim 1, wherein:
a first one of the first plurality of interconnected parallel sections is connected to the first liquid inlet;
each one of the first plurality of interconnected parallel sections except a last one of the first plurality of interconnected parallel sections is connected to a next one of the first plurality of interconnected parallel sections via one of a first plurality of U-shaped sections of the first continuous internal conduit;
the last one of the first plurality of interconnected parallel sections is connected to the first liquid outlet;
a first one of the second plurality of interconnected parallel sections is connected to the second liquid inlet;
each one of the second plurality of interconnected parallel sections except a last one of the second plurality of interconnected parallel sections is connected to a next one of the second plurality of interconnected parallel sections via one of a second plurality of U-shaped sections of the second continuous internal conduit; and
the last one of the second plurality of interconnected parallel sections is connected to the second liquid outlet.

7. The cooling arrangement of claim 1, wherein:
the first air-liquid heat exchanger unit is a first dual-flow air-liquid heat exchanger unit further comprising a third continuous internal conduit forming a third plurality of interconnected parallel sections extending within the first frame, the third continuous internal conduit connecting the first liquid inlet to the first liquid outlet; and
the second air-liquid heat exchanger unit is a second dual-flow air-liquid heat exchanger unit further comprising a fourth continuous internal conduit forming a fourth plurality of interconnected parallel sections extending within the second frame, the fourth continuous internal conduit connecting the second liquid inlet to the second liquid outlet.

8. The cooling arrangement of claim 7, wherein:
a first portion of the first plurality of interconnected parallel sections is located in a first plane within the first frame;
a second portion of the first plurality of interconnected parallel sections is located in a second plane within the first frame, the second plane being parallel to the first plane;
a first portion of the third plurality of interconnected parallel sections is located in the second plane within the first frame;
a second portion of the third plurality of interconnected parallel sections is located in the first plane within the first frame;
a first portion of the second plurality of interconnected parallel sections is located in a third plane within the second frame;
a second portion of the second plurality of interconnected parallel sections is located in a fourth plane within the second frame, the fourth plane being parallel to the third plane;
a first portion of the fourth plurality of interconnected parallel sections is located in the fourth plane within the second frame; and
a second portion of the fourth plurality of interconnected parallel sections is located in the third plane within the second frame.

9. The cooling arrangement of claim 1, further comprising:
the first cold supply line; and
the first hot return line.

10. The cooling arrangement of claim 9, wherein the first cold supply line and the first hot return line are connected to a secondary cooling system for the rack.

11. The cooling arrangement of claim 9, further comprising:
the second cold supply line; and
the second hot return line;

wherein the first cold supply line, the second cold supply line, the first hot return line and the second hot return line are connected to a secondary cooling system for the rack.

12. The cooling arrangement of claim 1, wherein each one of the first and second air-liquid heat exchanger units is configured to reduce a temperature of the air expelled from the rack to less than a maximum rated air temperature when the other one of the first and second air-liquid heat exchanger units is taken out of service.

13. The cooling arrangement of claim 1, further comprising a pair of hinges mounted on a lateral side of the first frame, the hinges being adapted for pivotally mounting the cooling arrangement on the rack.

14. The cooling arrangement of claim 1, further comprising a temperature sensor mounted on an external face of the second air-liquid heat exchanger unit and adapted to transmit a temperature of air having flowed through the first and second air-liquid heat exchanger units to a remote monitoring device.

* * * * *